US008724376B2

(12) United States Patent
Eigler et al.

(10) Patent No.: US 8,724,376 B2
(45) Date of Patent: May 13, 2014

(54) ANTIFERROMAGNETIC STORAGE DEVICE

(75) Inventors: Donald M. Eigler, Santa Cruz, CA (US); Andreas J. Heinrich, Morgan Hill, CA (US); Sebastian Loth, Hamburg (DE); Christopher P. Lutz, Felton, CA (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 13/234,073

(22) Filed: Sep. 15, 2011

(65) Prior Publication Data

US 2013/0070518 A1 Mar. 21, 2013

(51) Int. Cl.
*G11C 11/00* (2006.01)

(52) U.S. Cl.
USPC ............ 365/158; 365/148; 365/171; 977/933

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 428/810–816, 428/817–825.1, 826; 977/933–935
See application file for complete search history.

(56) References Cited

U.S. PATENT DOCUMENTS

| | | | | |
|---|---|---|---|---|
| 4,575,822 | A | 3/1986 | Quate | |
| 5,530,263 | A | 6/1996 | DiVincenzo | |
| 5,956,216 | A | 9/1999 | Chou | |
| 6,777,730 | B2 | 8/2004 | Daughton et al. | |
| 6,980,468 | B1 * | 12/2005 | Ounadjela | 365/171 |
| 7,719,883 | B2 | 5/2010 | Hochstrat et al. | |
| 7,746,689 | B2 | 6/2010 | Hannah | |
| 7,768,731 | B2 | 8/2010 | Inomata et al. | |
| 8,422,286 | B2 * | 4/2013 | Ranjan et al. | 365/171 |
| 2001/0038931 | A1 | 11/2001 | Carey et al. | |
| 2012/0320666 | A1 * | 12/2012 | Ohno et al. | 365/158 |

FOREIGN PATENT DOCUMENTS

| | | |
|---|---|---|
| JP | 07-333233 | 12/1995 |
| JP | 11-094857 | 4/1999 |
| JP | 2006-247795 | 9/2006 |
| JP | 2007-179710 | 7/2007 |
| JP | 2010-135610 | 6/2010 |
| JP | 2010-278442 | 9/2010 |
| WO | 2006-001332 A1 | 1/2006 |

OTHER PUBLICATIONS

International Search Report and Written Opinion from PCT Application No. PCT/IB2012/054220 dated Jan. 29, 2013.

(Continued)

*Primary Examiner* — Harry W Byrne
(74) *Attorney, Agent, or Firm* — Zilka-Kotab, PC

(57) ABSTRACT

An antiferromagnetic nanostructure according to one embodiment includes an array of at least two antiferromagnetically coupled magnetic atoms having at least two magnetic states that are stable for at least one picosecond even in the absence of interaction with an external structure, the array having a net magnetic moment of zero or about zero, wherein the array has 100 atoms or less along a longest dimension thereof. An atomic-scale structure according to one embodiment has a net magnetic moment of zero or about zero; two or more stable magnetic states; and having an array of atoms that has magnetic moments that alternate between adjacent magnetic atoms along one or more directions. Such structures may be used to store data at ultra-high densities.

12 Claims, 19 Drawing Sheets

100
102 102
Cu N Cu N

(56) References Cited

OTHER PUBLICATIONS

Bode et al., "Atomic spin structure of antiferromagnetic domain walls," 2006 Nature Publishing Group, Nature Materials, vol. 5, pp. 477-481.
Chen et al., "Magnetoelectric exchange bias systems in spintronics," 2006 American Institute of Physics, Applied Physics Letters, vol. 89, pp. 202508/1-202508/3.
Haney et al., "Current-induced torques in magnetic metals: Beyond spin-transfer," 2007 Elsevier B.V., Science Direct, Journal of Magnetism and Magnetic Materials, vol. 320, pp. 1300-1311.
Heinze et al., "Real-Space Imaging of Two-Dimensional Antiferromagnetism on the Atomic scale," Science, vol. 288, Jun. 9, 2000, pp. 1805-1808.
Herzog et al., "Heat assisted spin torque switching of quasistable nanomagnets across a vacuum gap," 2010 American Institute of Physics, Applied Physics Letters, vol. 96, pp. 102505/1-102505/3.
Romero, "Magnetic Storage Taken to the Atomic Scale," IEEE Spectrum, Sep. 2007, pp. 1-2.
Kimel et al., "Inertia-driven spin switching in antiferromagnets," 2009 Macmillan Publishers Limited, Nature Physics, vol. 5, Oct. 2009, pp. 727-731.
Krause et al., "Current-Induced Magnetization Switching with a Spin-Polarized Scanning Tunneling Microscope," Science, vol. 317, Sep. 14, 2007, pp. 1537-1540.
Mannini et al., "Magnetic memory of a single-molecule quantum magnet wired to a gold surface," Nature Materials, vol. 8, Mar. 2009, pp. 194-197.
Morup et al., "Experimental and theoretical studies of nanoparticles of antiferromagnetic materials," 2007 IOP Publishing Ltd., Journal of Physics, Condensed Matter, vol. 19, pp. 1-31.
Nunez et al., "Theory of spin torques and giant magnetoresistance in antiferromagnetic metals," 2006 The American Physical Society, Physical Review, vol. 73, pp. 214426/1-214426/9.
Pietzsch et al., "Observation of Magnetic Hysteresis at the Nanometer Scale by Spin-Polarized Scanning Tunneling Spectroscopy," Science, vol. 292, Jun. 15, 2001, pp. 2053-2056.
Khajetoorians et al., "Realizing All-Spin-Based Logic Operations Atom by Atom," Science, vol. 332, May 27, 2011, pp. 1062-1064.
Skumryev et al., "Beating the superparamagnetic limit with exchange bias," 2003 Nature Publishing Group, Nature, vol. 423, Jun. 19, 2003, pp. 850-853.
Wulfhekel et al., "Spin-Polarized Scanning Tunneling Microscopy of Magnetic Structures and Antiferromagnetic Thin Films," 2007 Annual Reviews, Annual Reviews of Material Research, pp. 69-91.
Examination Report from GB Application No. GB1401831.1 dated Mar. 12, 2014.
Ederer et al., "Electric-Field-switchable magnets: The case of BaNiF4," Physical Review B, vol. 74, 2006, pp. 020401/1-020401/4.

* cited by examiner

800

ANTIFERROMAGNETIC STORAGE DEVICE

BACKGROUND

The invention is in the field of the physics of data storage and computation, and more particularly, this invention relates to the ability to store magnetic information in antiferromagnetic nanostructures.

The ability to record digital information in the magnetic orientation of magnetic grains is at the heart of data storage in information technology devices. For several decades there has been exponential progress in reducing the effective area of individual magnetic elements. This basic idea has been applied to magnetic hard disk media, to magnetic tape media, and most recently to solid-state implementations such as spin-transfer torque magnetic random access memory. At present all of these devices utilize a ferromagnetic interaction between the magnetic atoms that constitute the active device element that stores the information bit. In disk and tape drives the magnetic information is read out by magnetoresistive sensors, which sense the magnetic field emanating from the ferromagnetic bit. Writing of the magnetic elements is achieved by creating a strong localized magnetic field from a write-head. In solid-state magnetic devices the magnetic bit is typically part of a magnetoresistive tunneling junction, which can be used for reading and writing the information.

BRIEF SUMMARY

An antiferromagnetic nanostructure according to one embodiment includes an array of at least two antiferromagnetically coupled magnetic atoms having at least two magnetic states that are stable for at least one picosecond even in the absence of interaction with an external structure, the array having a net magnetic moment of zero or about zero, wherein the array has 100 atoms or less along a longest dimension thereof.

An atomic-scale structure according to one embodiment has a net magnetic moment of zero or about zero; two or more stable magnetic states; and having an array of atoms that has magnetic moments that alternate between adjacent magnetic atoms along one or more directions.

An antiferromagnetic nanostructure according to one embodiment includes multiple arrays each corresponding to a bit, each array having at least eight antiferromagnetically coupled magnetic atoms, each array having at least two readable magnetic states that are stable for at least one picosecond, each array having a net magnetic moment of zero or about zero, wherein no external stabilizing structure exerts influence over the arrays for stabilizing the arrays, wherein each array has 100 atoms or less along a longest dimension thereof.

In yet another embodiment, a system, such as a magnetic data storage system or memory device, may include an antiferromagnetic nanostructure and/or atomic-scale structure as recited above; and at least one device for altering and/or reading the magnetic state of each of the arrays Other aspects and embodiments of the present invention will become apparent from the following detailed description, which, when taken in conjunction with the drawings, illustrate by way of example the principles of the invention.

DETAILED DESCRIPTION

Figure 1A:
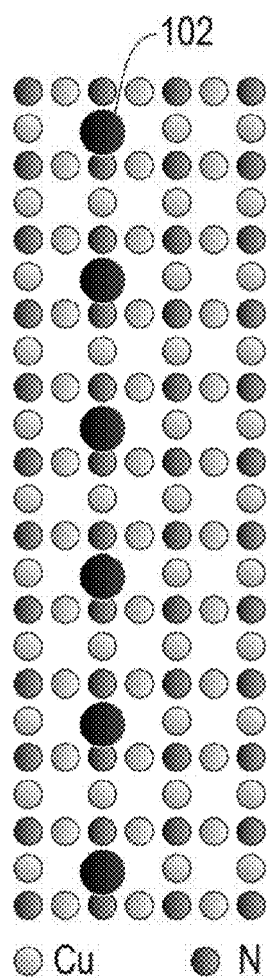
FIGS. 1A-1C are graphical depictions of an array of antiferromagnetically coupled magnetic atoms according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in reference books such as dictionaries, treatises.

It must also be noted that, as used in the specification and the appended claims, the singular forms "a," "an" and "the" include plural referents unless otherwise specified.

The following description discloses several preferred embodiments of antiferromagnetic nanostructures capable of storing information. Also disclosed are tunneling magnetoresistance devices for writing and reading the information.

In one general embodiment, an antiferromagnetic nanostructure includes an array of at least two antiferromagnetically coupled magnetic atoms having at least two magnetic states that are stable for a useful period of time such as at least one picosecond even in the absence of interaction with an external structure such as a ferromagnetic structure external to the array for stabilizing the array in at least one of the magnetic states. Thus, an external stabilizing structure is not present, nor required, in preferred embodiments. The array has a net magnetic moment of zero or about zero. The array has 100 atoms or less along a longest dimension thereof, i.e., the maximum number of atoms lying along a line in any dimension is 100 atoms. The total number of atoms in the array, then, may be 100 for a single line array, or more for 2D and 3D arrays having more than one atom in the second and/or third dimensions.

By "about zero" when referring to a net magnetic moment, what is meant is that the net magnetic moment per magnetic atom of the subject array is less than about 20% of the average magnetic moment of the magnetic atoms in the array. In preferred embodiments, the net magnetic moment per magnetic atom of each array is less than about 10% of the average magnetic moment of the magnetic atoms, and ideally less than about 5%.

In another general embodiment, an atomic-scale structure has a net magnetic moment of zero or about zero; two or more stable magnetic states; and includes an array of atoms that have magnetic moments that alternate between adjacent magnetic atoms along one or more directions. An "atomic-scale structure" may be defined as a structure having at least two atoms, and having 100 atoms or less along a longest dimension thereof, i.e., the maximum number of atoms lying along a line in any dimension is 100 atoms.

In yet another general embodiment, an anti ferromagnetic nanostructure includes multiple arrays each corresponding to a data bit (also referred to herein as a magnetic bit), each array having at least eight antiferromagnetically coupled magnetic atoms, each array having at least two readable magnetic states that are stable for at least one picosecond (or other useful period of time), each array having a net magnetic moment of zero or about zero, where no external stabilizing structures are required to exert influence over the arrays stabilizing the arrays, and where each array has 100 atoms or less along a longest dimension thereof.

In another general embodiment, a system, such as a magnetic data storage system or memory device, may include an antiferromagnetic nanostructure and/or atomic-scale structure as recited above; and at least one device for altering and/or reading the magnetic state of each of the arrays.

A method of reading and/or writing data to an atomic-scale antiferromagnet or antiferromagnetic nanostructure such as one of those recited above includes detecting a magnetic state of one atom of a selected one or more arrays of the antiferromagnetic nanostructure or atomic-scale antiferromagnet. During a write operation, the orientation of the magnetic moment of atoms of the atomic-scale antiferromagnet may be reversed for changing the magnetic state of the atomic-scale antiferromagnet. A tunneling magnetoresistance device may be used for detecting the magnetic state of the one atom of the atomic-scale antiferromagnet and/or changing the magnetic state.

Preferred embodiments of the present invention include magnetic nanostructures having a small number of antiferromagnetically coupled magnetic atoms arranged on a surface in such a way that the stable storage of magnetic information is possible. The magnetic atoms are coupled antiferromagnetically, meaning that the magnetic moments on neighboring magnetic atoms point in opposite directions. By "stable," "stable storage," and "useful period of time," what is meant is that the state of the array of magnetic atoms (where the state may correspond to magnetic information) is stored long enough to be useful for any type of process, such as data storage or data processing. For example, that storage may be mere picoseconds (ps), nanoseconds (ns), or milliseconds (ms), such as at least 1 ps, at least 1 ns, at least 1 microsecond, at least 1 ms, between 5 ps and 1000 ins, greater than 100 ms, at least 1 second, at least 1 minute, at least 1 hour, at least 1 day, between 1 ps and 1 hour, or any reasonable value in these ranges. Moreover, the period of stable storage may be represented in terms of a number of clock cycles of a processor interacting with data stored on the inventive structures, such as 1 clock cycle or more.

An antiferromagnetic array of magnetic atoms has advantages over the more traditional ferromagnetic pattern, as the anti ferromagnetic array has no long-range magnetic field associated with it. Particularly, a magnetic nanostructure having antiferromagnetically coupled magnetic atoms does not have a long-range external (to the array) magnetic field since the magnetic fields (of the constituent magnetic atoms) fully or mostly cancel each other. For example, anti ferromagnetic arrays corresponding to data bits can be placed closer to each other than ferromagnetic bits without interfering with each other. This phenomenon allows for a very dense packing of these magnetic nanostructures with the resulting advantage of increased storage density. When these magnetic nanostructures are used with a device such as an atomic-scale tunneling magnetoresistive device, the magnetic information can be written and read back with conventional electronic circuitry.

One preferred embodiment includes an array of magnetic atoms on a substrate. The magnetic atoms are arranged in such a way that their primary interaction with their nearest neighbors is antiferromagnetic, i.e., the magnetic moment of neighboring atoms points in opposite directions. The magnetic nanostructure can be a chain or a two-dimensional structure, or it can extend into the third dimension by adding magnetic layers on top of the initial two-dimensional layer while maintaining antiferromagnetic order.

The magnetic atoms may be of any magnetic material. Illustrative magnetic materials include iron, manganese, and cobalt.

The substrate may be any suitable material known in the art that does not destroy the antiferromagnetic character of the antiferromagnetic array. Preferably, the substrate is nonmagnetic. Illustrative materials for the substrate include $Cu_2N$ and CuO. Factors to consider when selecting a substrate material may include how the substrate affects the spacing of the magnetic atoms, and how the substrate material affects affinity of the atoms to become antiferromagnetically coupled.

Figure 1B:
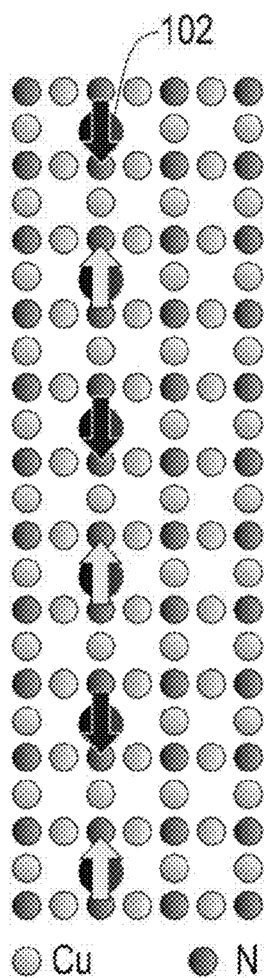
Figure 1C:
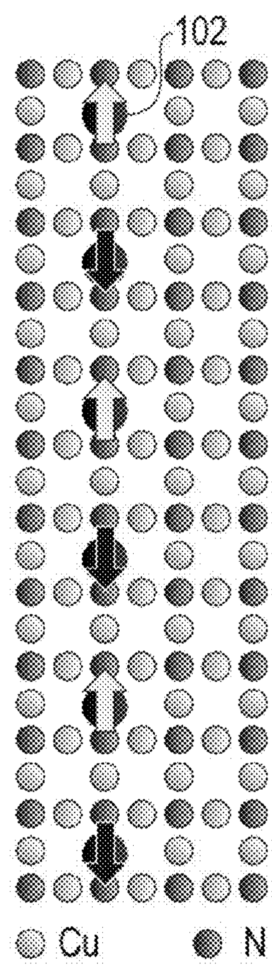

FIGS. 1A-1C depict an array of magnetic atoms on a crystalline substrate. Referring to FIG. 1A, the array 100 of magnetic atoms 102 is arranged in a linear chain. Particularly, a chain of several Fe atoms is assembled on a crystalline substrate by employing established techniques of atom manipulation on a substrate. Exemplary formation techniques are presented below. The substrate used in this example is a monolayer $Cu_2N$ film grown on a Cu(001) surface. This substrate is used in this example because it gives the Fe atoms easy-axis magnetic anisotropy, a useful property for implementing stable magnetic bits because it guides the spins to point along the axis. The Fe atoms are coupled antiferromagnetically. A linear chain of atoms, such as that shown in FIG. 1A, is a simple example of a type of magnetic bit. As shown, the magnetic moment orientations of the magnetic atoms in the array alternate between adjacent ones of the magnetic atoms. Note that while this example has six magnetic atoms, various embodiments may have as few as two magnetic atoms and up to several dozen or several hundreds of atoms.

A chain of 8 Fe atoms 102 assembled on this surface with the spacing shown in FIGS. 1A-1C has two stable magnetic states at sufficiently low temperature, the so-called Néel states. The temperature for these demonstrations is 1 Kelvin. In a Néel state neighboring magnetic atoms are magnetized in opposing directions. This is illustrated in FIGS. 1B and 1C. In FIG. 1B, the antiferromagnetic coupling between Fe atoms 102 in the chain results in one logic state, corresponding to the first Néel state, in which the topmost Fe atom 102 in the chain has a magnetic moment that is oriented "down". FIG. 1C depicts a second logic state of the bit, corresponding to the second Néel state, in which magnetic moment of the same Fe atom 102 in the chain is "up". The chain may be any length, and longer chains tend to result in magnetic states that are more stable. Note also the absence of any external stabilizing structure, such as a ferromagnet.

The magnetic moment of atoms is generally due, in part, to the magnetic moment of the atom's electron spins, and in part to the magnetic moment derived from the orbital angular momentum of the atom's electrons. The energy of magnetic interaction between the atoms can be due to direct exchange interaction, to indirect exchange interaction, and/or to magnetic dipolar interaction. The details of these interactions are known to those skilled in the art and discussion thereof is omitted for clarity.

A central finding is that, even though these magnetic nanostructures are of atomic-scale dimensions, they have two stable magnetic states at sufficiently low temperature. Furthermore, the antiferromagnetic array can be switched between these two states at will. This magnetic stability and the ability to switch between the magnetic states constitute two of the most important elements of magnetic data storage, and are here demonstrated on the atomic scale.

Figure 2:
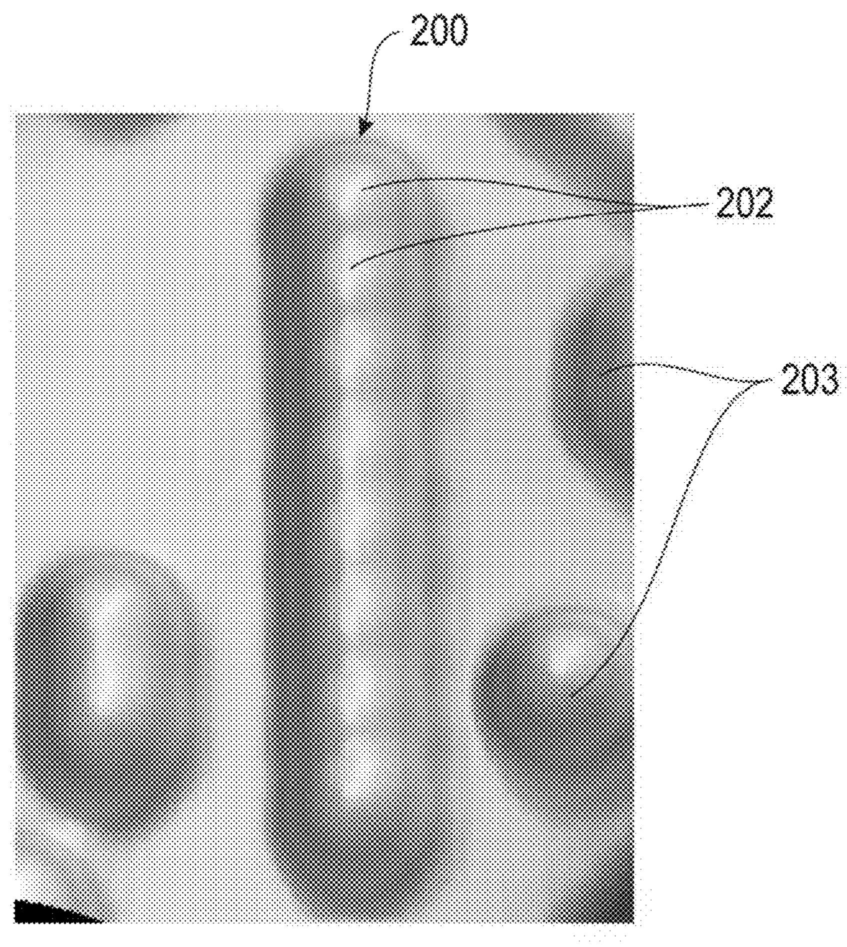
FIG. 2 is graphical representation of a scanning tunneling microscope (STM) topographic image of a chain of 8 Fe atoms according to one embodiment.

FIG. 2 is representation of a scanning tunneling microscope (STM) topographic image of a chain 200 of 8 Fe atoms 202. The atoms 202 are arranged on the surface of $Cu_2N$ as shown in FIG. 1. In this embodiment, the spacing between two neighboring Fe atoms is 0.72 nm giving the chain a length of about 6 nm. The other protrusions 203 around the chain are also Fe atoms in different spatial arrangements. The atoms of the chain 200 appear identical because the tip of the STM is not spin polarized. However, upon spin polarizing the tip, the magnetic state of one or more of the atoms is discernible.

One method to read and write such a magnetic bit is to couple the bit to a magnetic tunnel junction. To form such a junction in one approach, a control electrode is placed near the antiferromagnetic nanostructure so that electrons can flow between the control electrode and the nanostructure by means of quantum mechanical tunneling. The nanostructure and the control electrode may be separated by an insulating layer or a vacuum gap. The control electrode is spin polarized, meaning that it preferentially conducts electrons of one spin orientation more than the other orientation. The resulting tunneling junction is then magnetoresistive, i.e., the tunneling current depends on the relative alignment of the control electrode's and nearest magnetic atom's directions of spin polarization. This allows the state of the array to be sensed by measuring the amount of current flowing through the tunnel junction.

In one approach, the magnetic tunnel junction is aligned to a selected atom or group of atoms in the array. Reading the state of the array is performed by measuring the conductance of the tunnel junction. Writing may be performed by applying an appropriate voltage or current to the tunnel junction, which reverses the magnetic state of the array.

In one illustrative approach, the tip of a STM is used as the control electrode to perform the reading and/or writing of the magnetic bits. The tip of the STM can be made to be spin-polarized by any of several techniques, such as coating the tip with a ferromagnetic or antiferromagnetic material or placing a magnetic particle on the apex of the tip. For the present example, assume the STM tip is made to be spin-polarized by placing a magnetic atom at its apex and applying an external magnetic field to polarize that atom.

Due to the very high spatial resolution of the STM, the magnetic state of such an antiferromagnetic array may be written and read, and thus utilized for data storage at very high storage density, presently estimated to be on the order of 100 Terabit per square inch, or about 100 times denser than present commercial hard disk drive storage devices.

Figure 3:
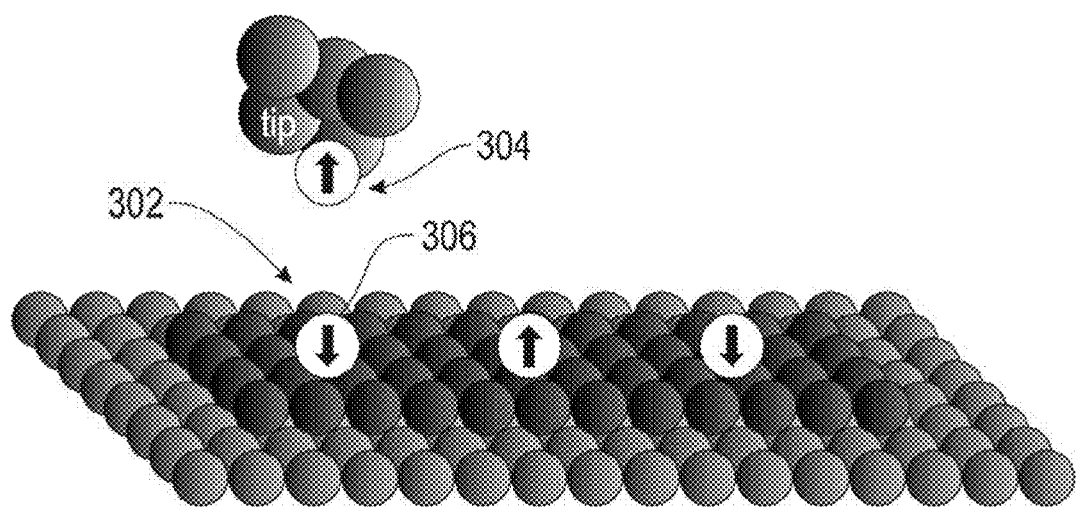
FIG. 3 is a graphical depiction of an implementation of reading and writing operations of a magnetic nanostructure by using the tip of an STM according to one embodiment.

FIG. 3 shows an implementation of the reading operation of an AFM magnetic bit 302 with a spin-polarized STM tip 304. When the STM tip is placed over a magnetic atom with its magnetic moment opposite to the spin polarization of the tip, the resulting current is low (i.e., the device is in a low-current tunneling magnetoresistance (TMR) state). On the other hand, when the tip is placed over a magnetic atom with its magnetic moment aligned with the tip, the resulting current is higher. Thus, when the tip 304 is placed above the leftmost atom 306 in the magnetic chain (as shown) the tunneling current is small because the spin of the tip (up arrow) points in a direction opposite that of the magnetic moment of the atom below it (down arrow).

Thus, a read operation is performed by measuring the tunnel current. Positioning the tip over the next magnetic atom to the right also reads the nanostructure's state, but the current magnitudes are reversed. By choosing proper magnitudes of tunneling voltage and current the same tip can be used to write the magnetic nanostructures into either of the two stable magnetic states, which function as the two logic states of a binary memory device.

This contrast mechanism is easily able to distinguish between the two different Néel states of the bit. By holding the tip stationary over just one of the atoms and measuring the conductance of the junction, the magnetic state of the structure can be determined. For example, a small voltage can be applied between the tip and the substrate and the measured tunnel current indicates the state of the bit.

Other techniques and devices for reading and/or writing may be used. One example is inclusion of a magnetic tunnel junction sensor near a terminal atom of each array.

Figure 4A:
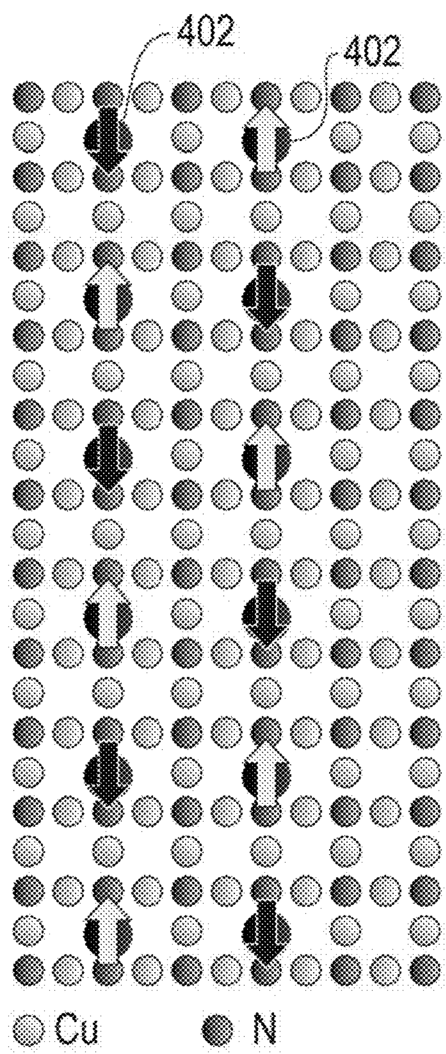
FIGS. 4A-4B are graphical depictions of an array of antiferromagnetically coupled magnetic atoms according to one embodiment.
Figure 4B:
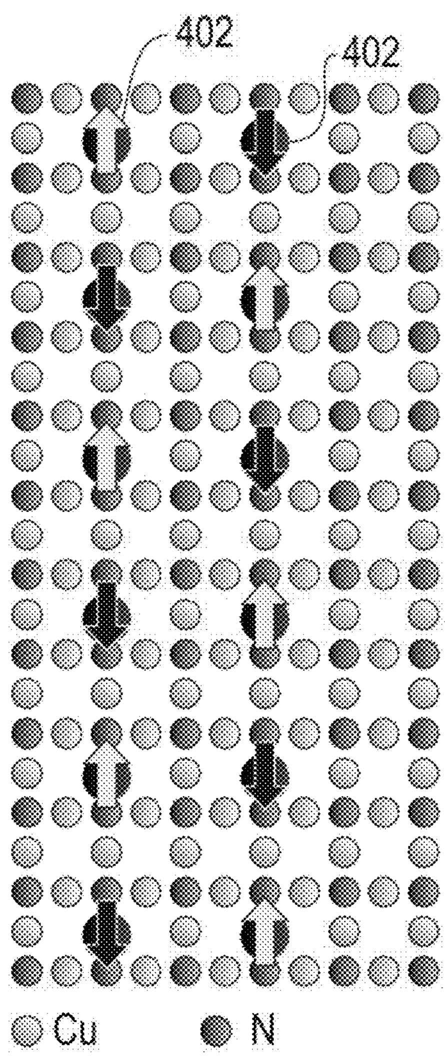

FIGS. 4A and 4B depict another implementation of an embodiment of the present invention. Particularly, FIGS. 4A and 4B respectively show a representation of both stable states (the Néel states) of the array. In this type of antiferromagnetic bit, two rows of magnetic atoms 402 are coupled together into a 2×6 array of atoms to form a single bit. Each column of six antiferromagnetically coupled Fe atoms is then antiferromagnetically coupled to a second column of Fe atoms to form the bit. This type of array also shows the basic property of having two states that are stable, so the magnetic state of this array structure can be used for data storage.

Similar to the linear chain of Fe atoms discussed in FIG. 1, the regular AFM pattern in the 2×6 array results in a canceling of the dipole magnetic fields due to the magnetic moments of the constituent Fe atoms, and therefore the 2×6 magnetic bit has no or substantially no magnetic field external to the array. Furthermore, this canceling of the magnetic moments results in the state of the magnetic bit being very insensitive to applied magnetic fields. An experiment mimicking this arrangement was tested and observed to be stable in a magnetic field of 3 Tesla.

The structure shown in FIGS. 4A and 4B can be used at higher temperatures than the six-atom structure shown in FIG. 1 due to the fact that the two columns couple antiferromagnetically to each other, which stabilizes the magnetic state.

The switching operation of a magnetic bit is described in FIG. 5. The left panel is the initial magnetic state of the bit, labeled as logic 1. After imaging the magnetic state the STM tip is positioned near one atom of the magnetic bit. A short pulse of less than 1V and a few nanoseconds duration is sufficient to switch the orientation of the magnetic moments of all the atoms of the magnetic bit, thereby switching the bit from the initial to the final magnetic state. The final magnetic state is then imaged again with the same magnetic tip and is labeled as logic 0. This switching is can be repeated many times without disturbing the physical structure of the magnetic bit.

Figures 5A, 5B, 5C:
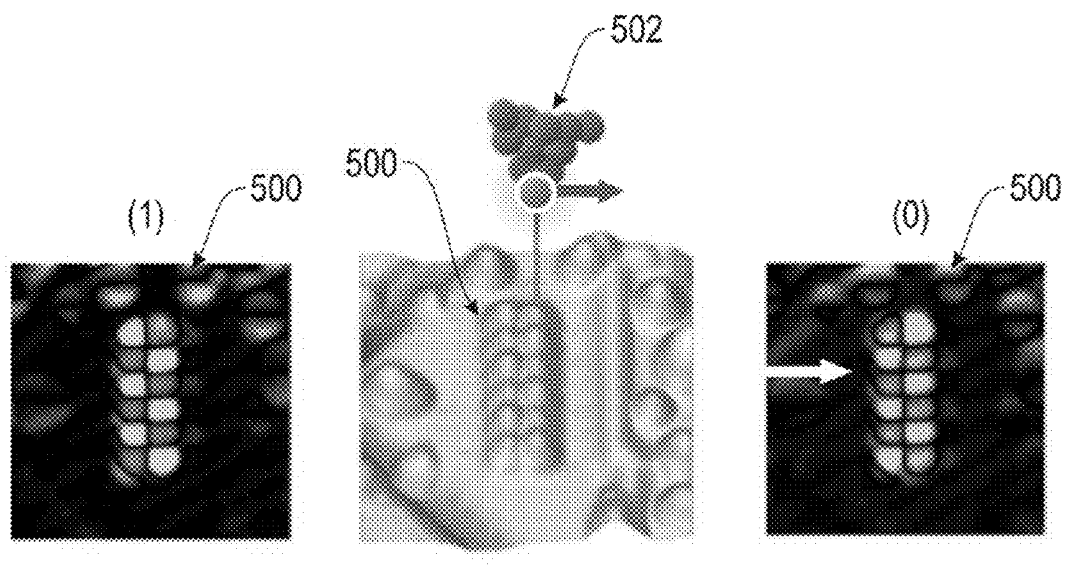
FIG. 5A is a graphical depiction of an array of antiferromagnetically coupled magnetic atoms in a first state according to one embodiment.
FIG. 5B is a graphical depiction of changing the state of the array of FIG. 5A according to one embodiment.
FIG. 5C is a graphical depiction of the array of FIG. 5A in a second state according to one embodiment.

FIGS. 5A, 5B and 5C depict reading and switching the state of an antiferromagnetic magnetic bit 500. The bit is assembled from 12 Fe atoms by using the tip of an STM 502 to position the atoms. The atoms appear alternately slightly higher and lower in the topograph (FIG. 5B) because the spin of the STM tip is aligned either the same or opposite to the orientation of the magnetic moment of each atom in the nanostructure. FIG. 5A shows a measurement of the magnetic moment orientations of each atom for the initial magnetic state, labeled as logic 1. Magnetic-moment-up atoms appear darker while magnetic-moment-down atoms appear lighter. Then the STM tip is brought into interaction with one of the atoms of the bit (FIG. 5B). Under the application of a short voltage pulse the magnetic state switches to the second stable state, labeled 0, as depicted in FIG. 5C.

Figure 6:
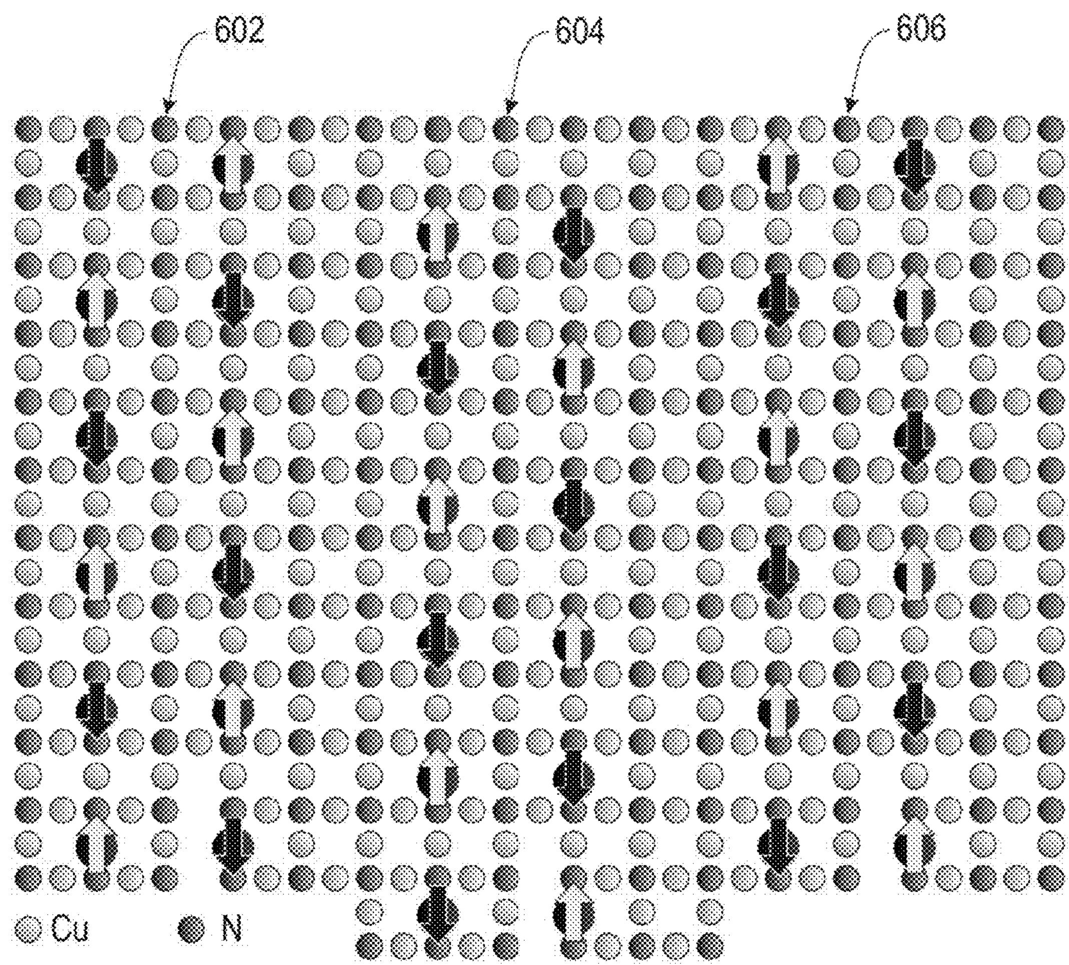
FIG. 6 is a graphical depiction of multiple arrays of antiferromagnetically coupled magnetic atoms on a common substrate, according to one embodiment.

An antiferromagnetic magnetic bit has several significant advantages over the more common ferromagnetic magnetic bit. FIG. 6 shows dense packing that is possible due to the antiferromagnetic nature of the magnetic bits. Thus, some embodiments may include multiple arrays of at least two antiferromagnetically coupled magnetic atoms present on a common substrate, each of the arrays having at least two magnetic states, wherein each array has a net magnetic moment (or net "spin") of about zero. Moreover, in particularly preferred embodiments, the arrays are positioned relative to each other such that the magnetic interaction energy between arrays is at least partially canceled. "Partially cancelled" can be defined in terms of a cancellation of magnetic interaction energy with an array and its nearest neighbor array, where the partial cancellation is 50% or more, preferably 75% or more, and more preferably 90% or more. In some illustrative approaches, the cancellation is 50-90%, 60-80%, and 75-100%. In an ideal case, the magnetic interaction energy is 100% or about 100% canceled.

Referring again to FIG. 6, three magnetic bits 602, 604, 606 having 12 Fe atoms each are arranged on a substrate of $Cu_2N$, and are separated by a short distance, e.g., 0.5-5 nm. In the approach shown, the distance of separation is 1 nm, which is just one more atomic lattice distance than the Fe atoms within the magnetic bit itself. As discussed above, the antiferromagnetic magnetic bits have no long-range magnetic fields and as such the long-range interactions can be expected to be negligible. However, over the short distances between the closest atoms in neighboring bits, a superexchange interaction has to be considered. A key observation is that the net coupling of one atom to its neighbors in an adjacent magnetic bit is zero since that atom interacts equally with a magnetic-moment-up atom and a magnetic-moment-down atom of a neighboring bit, independent of the neighboring bit's magnetic state. This symmetry effectively cancels the interactions on the short length, giving rise to essentially no net interaction between neighboring, thereby allowing the high packing density while also making the bits insensitive to applied magnetic fields.

Figure 7:
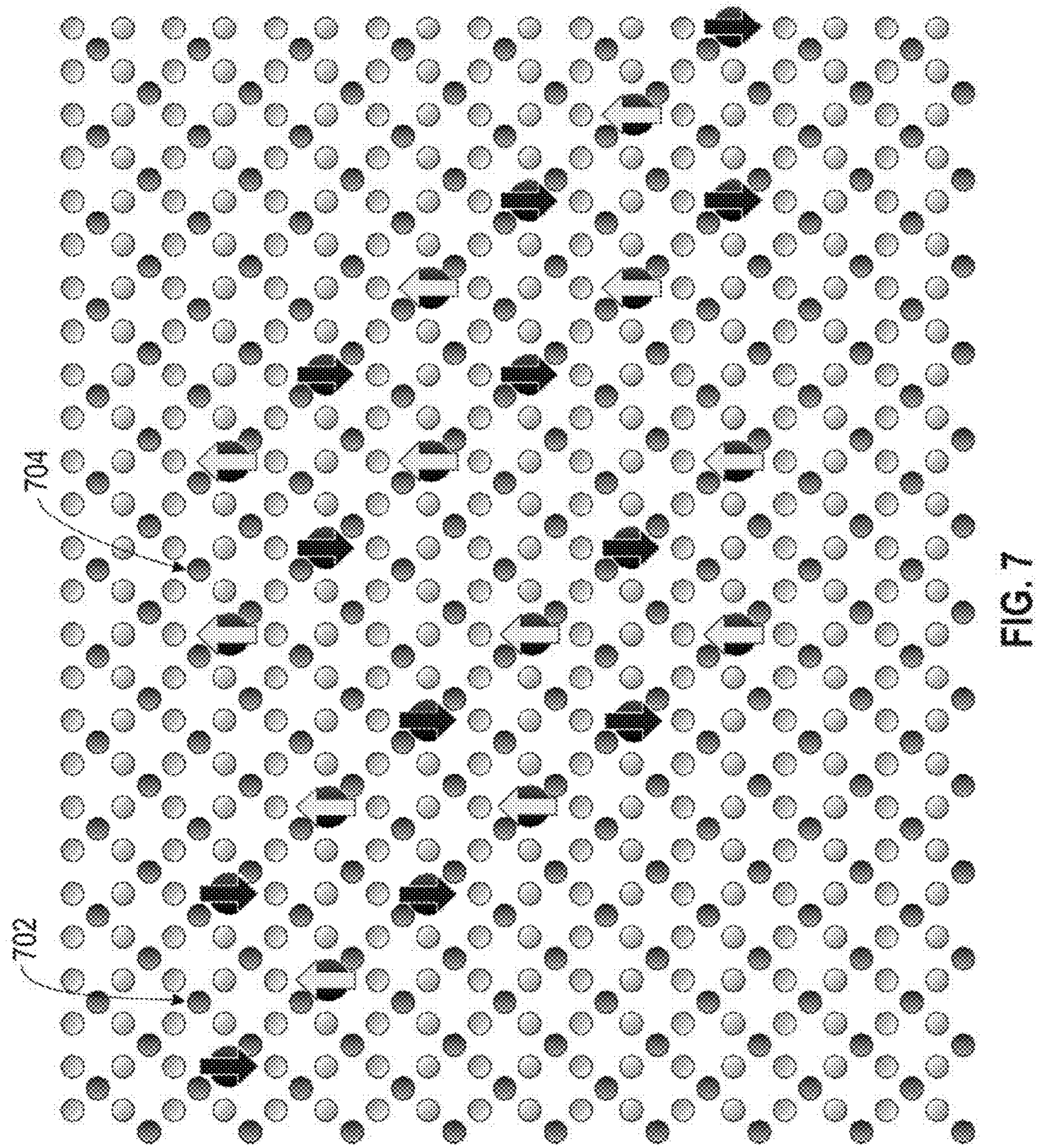
FIG. 7 is a graphical depiction of multiple arrays of antiferromagnetically coupled magnetic atoms on a common substrate, according to one embodiment.

FIG. 7 depicts an embodiment of two magnetic bits 702, 704 on a common substrate of $Cu_2N$. Particularly, two magnetic bits are shown, each made from 12 Fe atoms on a substrate of $Cu_2N$. The depiction of the substrate is 45 degrees rotated in comparison to the orientation of the substrate in FIG. 6. However, the successive bits are placed on a 45 degree angle with respect to the antiferromagnetic chains within the bits. Dense packing of magnetic bits 702, 704 is again possible since the Fe atoms inside each bit are coupled almost equally to the Fe atoms of opposite magnetic moment orientation in the neighboring bit. This embodiment demonstrates that the exact arrangement of atoms is not critical as long as a correct balancing of the short length scale magnetic interaction energy is fulfilled.

Figure 8:
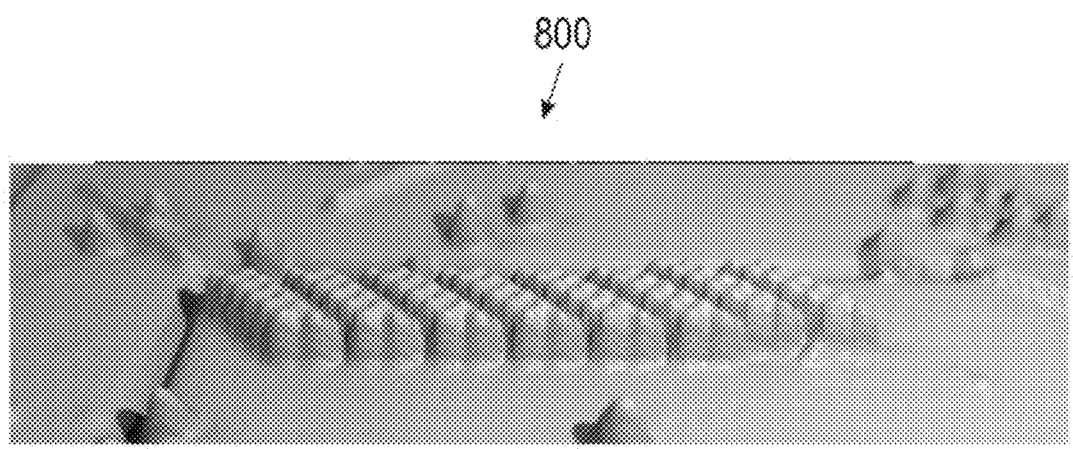
FIG. 8 is a graphical depiction of multiple arrays of antiferromagnetically coupled magnetic atoms on a common substrate, according to one embodiment.

FIG. 8 shows a larger assembly 800 of AFM magnetic bits. The depiction shows eight magnetic bits arranged in the packing arrangement as represented in FIG. 7. Each individual bit is composed of a regular array of 2×6 Fe atoms. In total, the byte includes 96 precisely positioned Fe atoms. This magnetic byte demonstrates data storage on the atomic scale at a storage density or about 100 Terabits per square inch.

The requirement of atomic-scale precision when aligning the control electrode to the magnetic bit can be relaxed in some cases, such as when the control electrode is an antiferromagnet with similar crystal lattice dimensions as the bit, or when several atoms of the antiferromagnetic bit that have the same magnetic moment alignment are used to form the tunnel junction. For example, the top-most two atoms in each bit of FIG. 7 have the same magnetic moment alignment, as does the top plane of atoms in FIG. 9B.

Figure 9A:
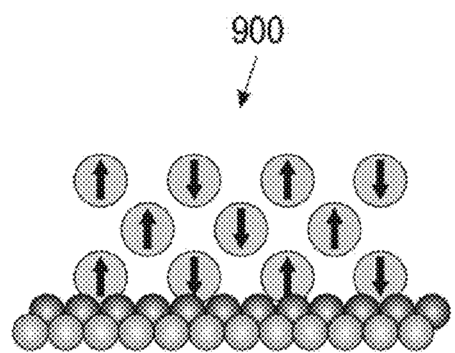
FIGS. 9A-9B are graphical depictions of arrays of antiferromagnetically coupled magnetic atoms extending in three dimensions, according to one embodiment.
Figure 9B:
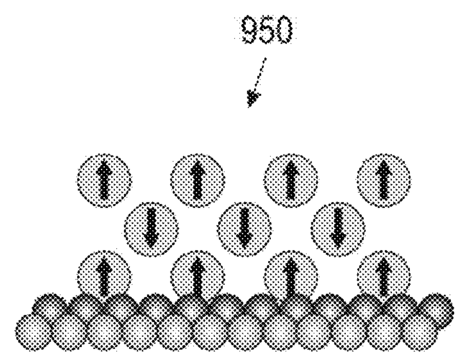

The previous description has primarily been directed to 1- and 2-dimensional arrays of magnetic atoms. Storing magnetic information in an AFM structure can also be performed using 3-dimensional structures, in some embodiments. Exemplary 3-dimensional configurations 900, 950 are schematically shown in FIGS. 9A and 9B, respectively.

In one embodiment, an antiferromagnetic nanostructure includes one or more arrays, where each array includes at least two layers of the magnetic atoms in a stacked configuration, the atoms in each layer being antiferromagnetically coupled to other atoms in the same layer, where a net magnetic moment of each layer is about zero. In the exemplary embodiment shown in FIG. 9A, an AFM layer is positioned on top of another AFM layer, and the AFM order is thus continued into the third dimension. The coupling between atoms within a horizontal layer is antiferromagnetic, as illustrated by the arrows showing the orientation of the magnetic moments, so the net magnetic moment of the entire structure is about zero. Coupling between and within successive layers may be antiferromagnetic, ferromagnetic, or both, depending on the details of the crystal structure, as long as it maintains alternation in magnetic moment orientation along some dimension.

In one embodiment, an antiferromagnetic nanostructure includes one or more arrays, where each array includes at least two layers of the magnetic atoms in a stacked configuration, the atoms in each layer being ferromagnetically coupled to other atoms in the same layer (i.e., having the same magnetic moment orientations as the other atoms in the same layer), wherein a net magnetic moment of adjacent layers is about zero. In the structure of FIG. 9B, for example, a ferromagnetic layer is put on top of another ferromagnetic layer, and successive layers have opposite magnetic moment orientation. On the right the magnetic moments within any horizontal layer are aligned (ferromagnetic ordering) but the coupling between layers is antiferromagnetic, so the net magnetic moment is again essentially zero.

Antiferromagnetic order is thus achieved in the third dimension. A three-dimensional embodiment has the advantage of a higher packing density for the same number of magnetic atoms in a magnetic bit. Because the thermal stability is expected to grow with the number of magnetic atoms in the bit, an extension into the third spatial dimension consequently enables extreme areal data density with good performance.

Many techniques for fabricating the antiferromagnetic arrays are possible. In one approach, a technique employing self-assembly of magnetic atom patterns on surfaces may be used. Another approach employs synthesis of antiferromagnetic molecules that contain the magnetic atoms and couples them in an antiferromagnetic arrangement.

In yet another approach, the tip of an STM is used to arrange the atoms on the substrate, to construct the magnetic nanostructure. The same or another STM may be used to perform the reading and writing of the magnetic bits. An STM inherently has atomic-scale spatial resolution and as such allows the direct demonstration of various embodiments.

Figure 10:
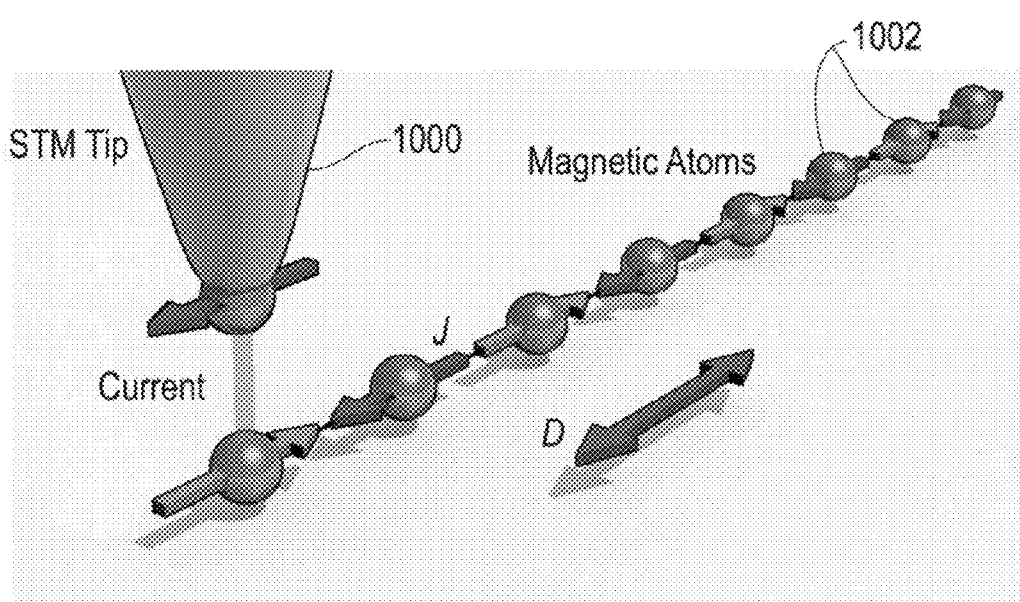
FIG. 10 is a graphical depiction of an implementation of a reading or writing operation of a magnetic nanostructure by using the tip of an STM according to one embodiment.

In one illustrative embodiment, depicted in FIG. 10, an STM 1000 is used to place Fe atoms 1002 in a regular pattern on a substrate, e.g., of $Cu_2N$. The Fe atoms may each be placed at a binding site on the substrate in which they have a large magnetic anisotropy, causing the Fe atom's magnetic moment to align parallel to the resulting easy axis D. This anisotropy impedes the magnetic moment from switching between the two possible orientations. Neighboring Fe atoms interact antiferromagnetically with exchange coupling energy J. This anisotropy and exchange coupling may allow the magnetic moments to be described using the Ising model, in which the magnetic moments always point along one axis and quantum superposition states may not have to be considered.

With continued reference to FIG. 10, the AFM array can be switched between the two Néel states by tunneling electrons from the STM tip 1000. To switch the magnetic state, an STM tip is held stationary over any Fe atom of the structure and tunnel current passed through it until a step is observed in the current. See, e.g., FIG. 11A.

EXPERIMENTAL

This section discusses experimental results. The following description is not meant to be considered limiting on the present invention in any way. Rather, the following description is provided by way of example only.

Sample Preparation

All experiments were performed in a low-temperature STM equipped with a variable magnetic field. Cu(100) single crystals were cleaned by repeated sputter-anneal cycles. One monolayer of $Cu_2N$ was formed by nitrogen ion bombardment of the clean Cu(100) near room temperature, and subsequent annealing to about 300° C. Fe (and Mn) atoms were deposited onto the cold sample surface at 4.2 K with a density of ~1% of a monolayer.

Fe atoms were positioned 0.72 nm apart on the two-fold symmetric Cu binding sites of the $Cu_2N$ overlayer using vertical atom manipulation. Surface and spacing were chosen to give magnetic coupling that is adequate to demonstrate antiferromagnetism, while keeping the atoms well enough separated to clearly resolve the location and magnetic moment orientation of each one. For atom pick-up, the probe tip was lowered close to point-contact (~100 kOhm junction resistance) and a sample voltage of +1.7 V was applied while withdrawing the tip. Drop-off employed a two-step process in which the atom was first positioned atop a nitrogen surface atom (N-binding site) by lowering the loaded tip into point-contact and withdrawing at zero voltage, and subsequently the dropped atom was hopped laterally to a Cu binding site with a +0.75 V voltage pulse with the tip positioned laterally to guide the atom to the intended binding site.

Spin Polarized Tips

Spin-polarized tips were created by transferring one or more magnetic atoms (Fe or Mn) from the surface to the apex of the tip. Such a tip behaves like a paramagnet and gives spin-polarized tunnel currents at <10K when external magnetic fields of >0.5 T are applied. The degree of spin-polarization of the tips was determined from measurements on isolated Fe and Mn atoms. Using the customary definition of the spin-polarization, $\eta$, we determined $\eta=0.6$ for the tip used in FIG. 10 and $\eta=0.3$ for the tip in FIG. 13C. Tips with reverse spin-polarization (anti-aligned to the magnetic field) were produced by placing more than one magnetic atom at the apex, the atoms presumably coupling to each other antiferromagnetically. The magnetic contrast does not depend significantly on the magnitude or sign of the applied voltage as long as the junction voltage is small enough (<~5 mV) to avoid disrupting the orientations of the magnetic moments of the AFM structure.

Array Magnetic State Switching

In experiments in which the magnetic states were switched, it was observed that the state switches most readily when the tip was placed over an atom at the end of an array. For any voltage and current applied, the switching between magnetic states was found to occur with a uniform probability per unit time, which can be characterized by way of a switching rate. This rate increased rapidly when the tunneling current was increased by moving the tip closer to the surface, as discussed below with reference to FIG. 11C.

Figure 11A:
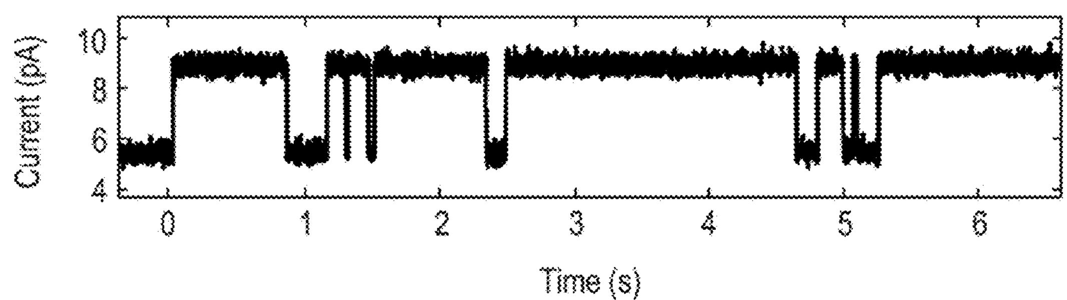
FIG. 11A is a chart of a tunnel current as a function of time with an STM tip positioned over an end atom of an array of antiferromagnetically coupled atoms according to one embodiment.
Figure 11B:
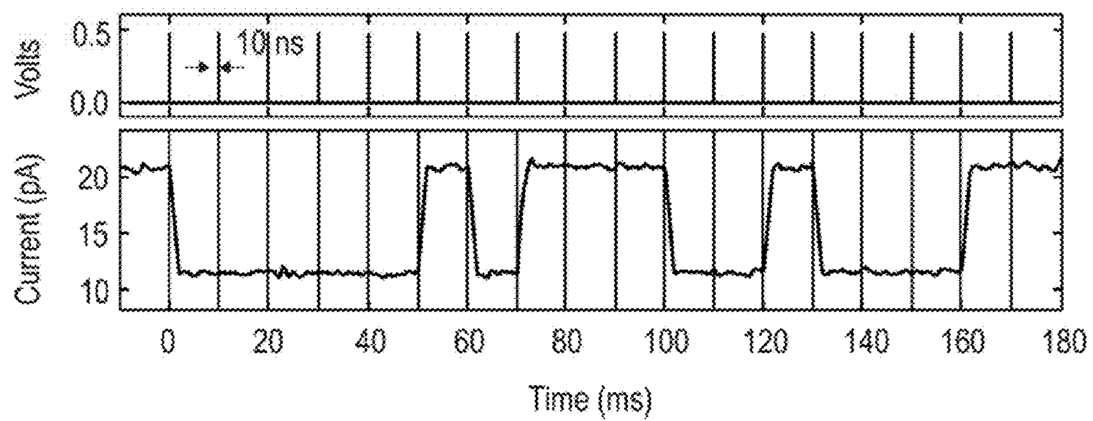
FIG. 11B is a chart of a tunnel current as a function of time with an STM tip positioned over an end atom of an array of antiferromagnetically coupled atoms according to one embodiment.
Figure 11C:
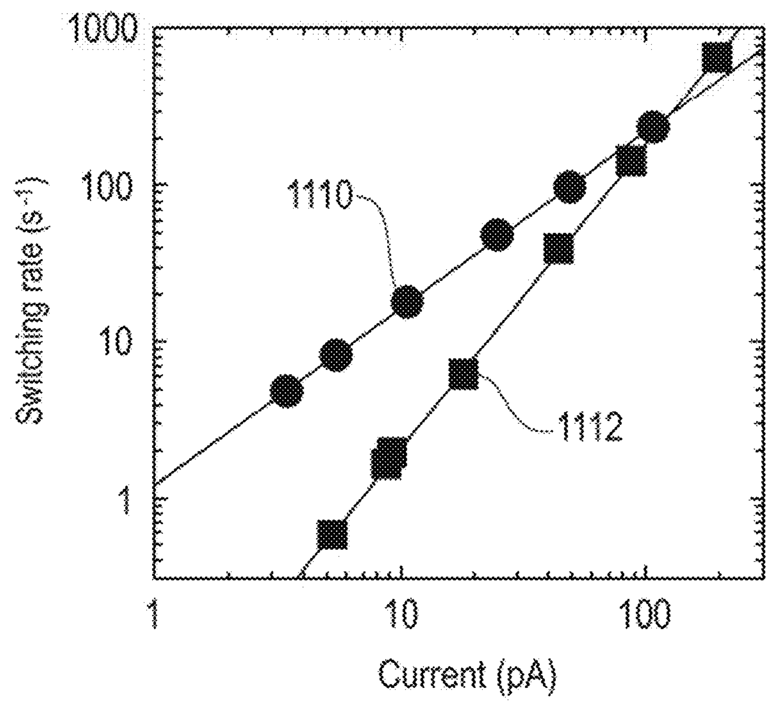
FIG. 11C is a chart showing switching rates at various tunnel current levels according to one embodiment.
Figure 11D:
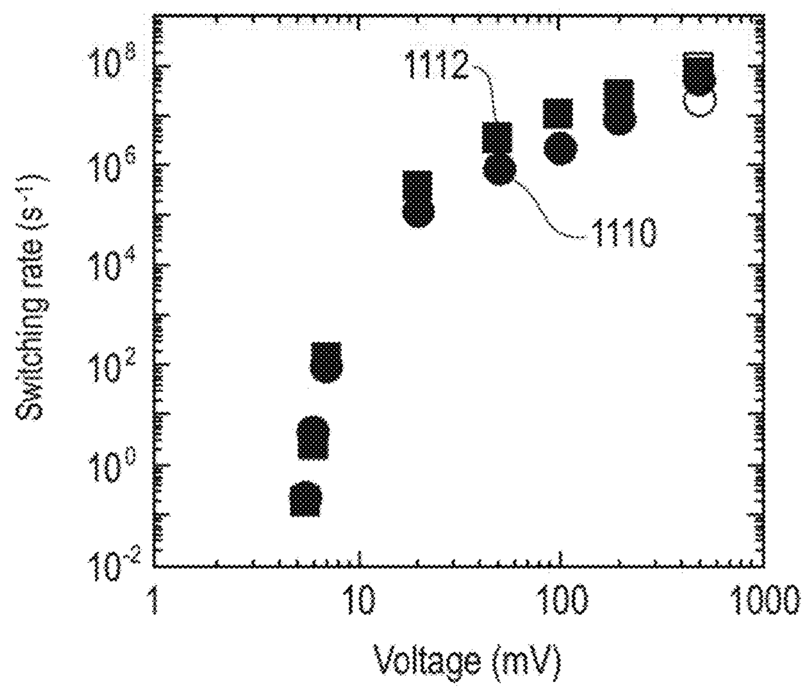
FIG. 11D is a chart showing switching rates at various voltage levels according to one embodiment.

In one experiment, switching between Néel states was induced by tunneling electrons. FIG. 11A is a chart depicting tunnel current as a function of time with an STM tip placed over an end atom of a 1×8 array of Fe atoms at 7 mV. The chain switches its magnetic state about twice per second. Referring to FIG. 11B, the same technique was applied, except that shorter voltage pulses were applied to demonstrate fast switching. Particularly, pulses of 500 mV and 10 ns duration were applied every 10 ms. Between pulses only 2 mV, which was below the threshold for switching, was applied to sense the magnetic state. Referring to FIG. 1 IC, the switching rates from magnetic state '0' to '1' (dots 1110) and '1' to '0' (dots 1112) at 7 mV and different tunnel currents, were obtained by changing the tip-sample distance. The switching rates increased according to a power law dependence with exponent k=1.1 ('0' to '1') and 1.9 ('1' to '0'). FIG. 11D is a chart graphically depicting switching rates at different voltages for the same array from which the data was obtained for FIG. 11C. As shown, faster switching was obtained at higher voltages. Voltage was applied continuously (for V<10 mV), and as 5-1000 ns pulses (for V>10 mV). The magnetic field applied was 1 T for all panels (FIGS. 11A-11D), the tip-sample distance was set at 20 pA, and the voltage was 2 mV for (FIGS. 11A-11C).

With the tip at a fixed height, the switching rate increased abruptly near the threshold voltage and quickly exceeded the bandwidth of the STM's current amplifier (FIG. 11B). A pulsed excitation scheme was used to obtain a quantitative measure of the switching rate in this regime. Sub-microsecond pulses were applied and each was followed by a 100 ms low-voltage window in which the resulting state was monitored.

Switching rates were extracted from the measured probabilities for switching at each pulse. The switching rate increased faster than in proportion to the voltage up the highest voltage tested, with switching times of ~20 ns at 0.5 V and ~5 nA (FIG. 11D). This demonstrates electrical switching of the AFM nanostructures at high speeds and femtojoule energies.

Figure 12A:
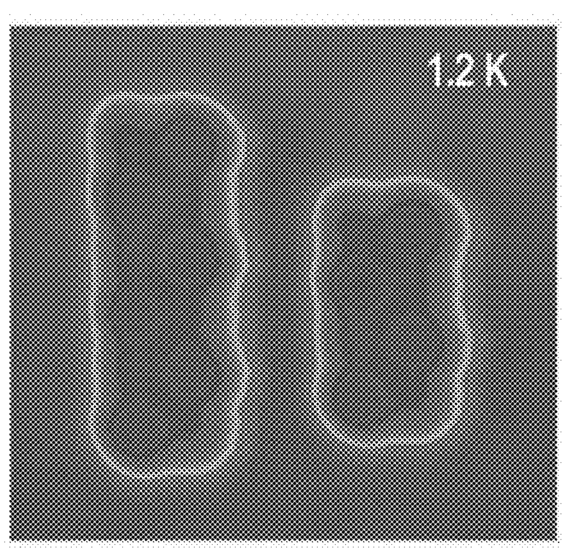
FIG. 12A is a graphical depiction of a (2×6) and (2×4) array of Fe atoms according to one embodiment.
Figure 12B:
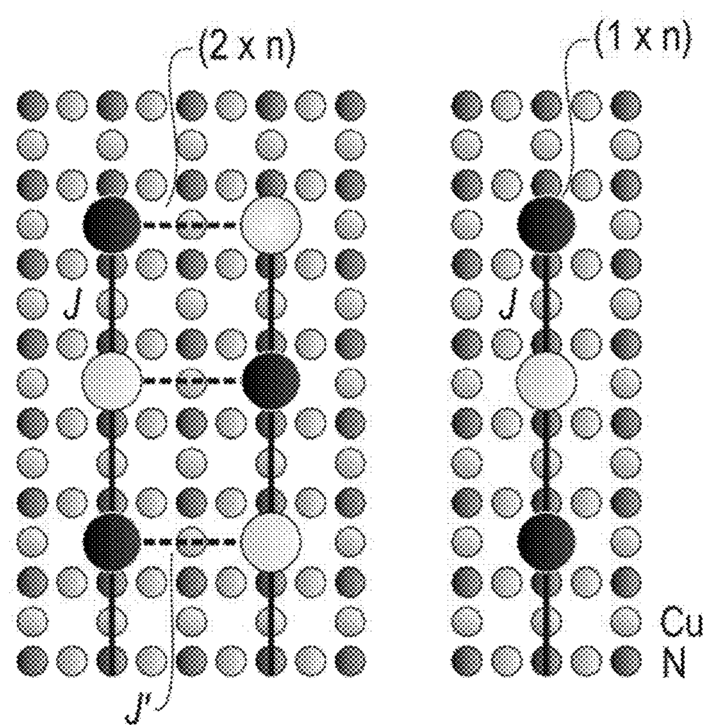
FIG. 12B is a schematic of atomic positions of Fe and $Cu_2N$ substrate atoms in a (2×n) and (1×n) arrays according to one embodiment.

The AFM ordering can be extended in two dimensions to form arrays. FIG. 12A depicts a (2×6) and (2×4) array of Fe atoms. These arrays each have two chains of the kind shown in FIG. 10, with the two chains coupled to each other antiferromagnetically with a coupling J'=0.035 meV between each pair of atoms, as represented in FIG. 12B, which is a schematic of the atomic positions of Fe and $Cu_2N$ substrate atoms in (2×n) and (1×n) arrays. This inter-chain coupling is much weaker than the coupling within each chain even though the spacing between the atoms is identical. This difference is believed to be due to the structure of the binding site of the Fe atom. Despite the weak coupling between the chains, the arrays show stable antiferromagnetic order with much greater stability than either chain alone.

To investigate the magnetic stability of the Néel states, the thermal switching rates of the arrays were examined. At 1.2 K both the (2×6) and the (2×4) arrays are stable in either Néel state. In contrast, at 5.0 K both nanostructures switch spontaneously between their two Néel states. At an intermediate temperature of 3.0 K only the (2×6) array is stable demonstrating that the blocking temperature—where magnetic structures lose their permanent spin state—increases with the number of atoms in the array.

Figure 12C:
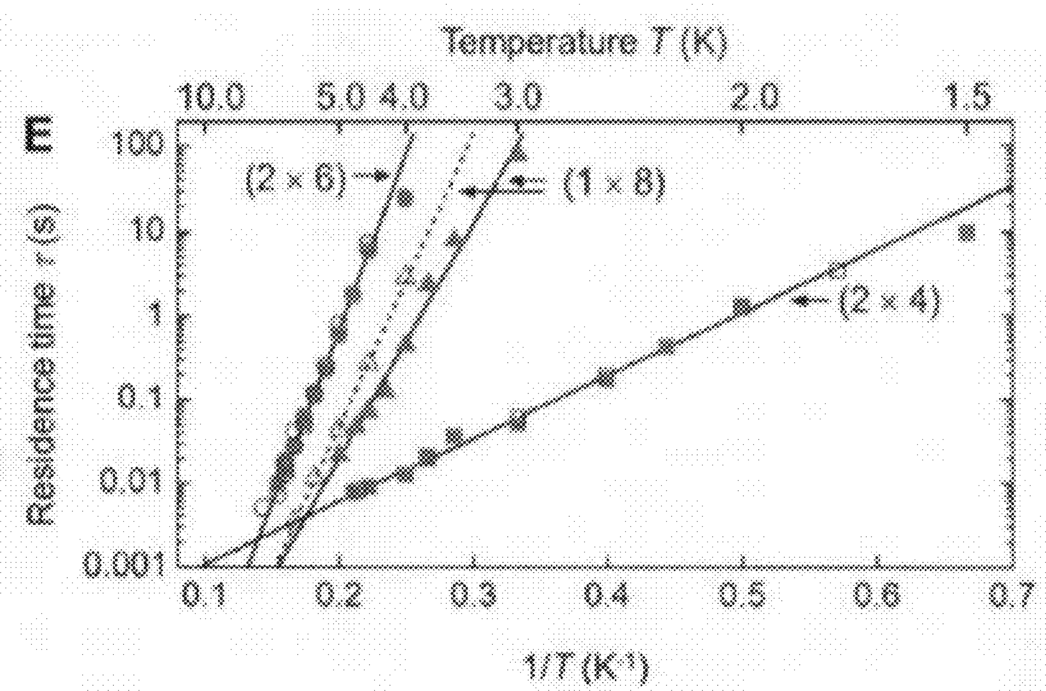
FIG. 12C is an Arrhenius plot of the residence time for the arrays of FIG. 12A and the (1×8) array of FIG. 10.

A quantitative study of the thermal stability of the Néel states (FIG. 12C) shows that each structure follows an Arrhenius law over the observed range of switching rates. From this an effective energy barrier and pre-exponential factor can be deduced for each structure, as shown in Table 1, which lists Arrhenius parameters for thermal switching rates of FIG. 12C. The Arrhenius function $\tau - \tau_0 \exp(E_B/k_BT)$ is fitted to the temperature-dependent residence times of each structure.

TABLE 1

| Array size | Magnetic field | Prefactor $\tau_0$ (s) | Energy barrier $E_B$ (meV) |
|---|---|---|---|
| (2 × 6) | 1 T, 3 T | $3 \times 10^9$ | 8.2 ± 0.2 |
| (1 × 8) | 1 T | $5 \times 10^9$ | 6.9 ± 0.1 |
| (1 × 8) | 3 T | $5 \times 10^8$ | 5.6 ± 0.3 |
| (2 × 4) | 1 T, 3 T | $2 \times 10^4$ | 1.49 ± 0.03 |

The two Néel states occur with equal frequency, as expected for degenerate states, and the switching events occur with a fixed probability per unit time. This is consistent with a model in which transitions between the Néel states require excitation over a spin reversal barrier. The energy barriers and prefactors are only weakly sensitive to magnetic field, which shows that the behavior of the structures is essentially unchanged over a wide range of applied magnetic fields.

For the (2×6) and (1×8) structures, the switching barriers obtained from the Arrhenius fit were ~6-8 meV (Table 1), which are comparable to the energy $2S^2J$=9.6 meV needed to create a single Ising domain wall within one of the chains by flipping the orientation of the magnetic moment of one or more consecutive atoms at the end of a chain. Here S=2 is the magnitude of the spin of the Fe atom. This energy barrier is also comparable to the threshold voltage for current-induced switching (FIG. 2). This suggests a switching process that reverses one chain at a time by propagating a domain wall along each chain. The (2×6) array is highly stable at low temperatures; we experimentally determined a lower limit for the stability to less than 1 switching event per 17 hours at 0.5 K.

In contrast, the (2×4) structure has a much smaller barrier, only 1.4 meV, which is comparable to $4\times2S^2J'$=1.1 meV, the energy required to frustrate the weak coupling between the two chains but not enough to create a domain wall within a chain. Together with the much reduced prefactor, this low barrier points to a reversal process in which one entire chain switches in a thermally-assisted magnetic tunneling process. Such tunneling of magnetization is often observed in molecular magnets.

To achieve long-term stability, a switching barrier of some 50 $k_BT$ (for antiferromagnets just as for ferromagnets) is desirable, which is 1.3 eV at room temperature.

This is about 100 times higher than the presently-described barrier, which is small due to the ease of introducing a domain wall, a consequence of small J. Much stronger coupling may be readily obtained on this surface and in typical AFMs by placing the atoms closer together. Using such stronger coupling, and the anisotropy barrier already present for Fe on this surface, room temperature stability may be achieved with ~150 atoms.

Figure 13A:
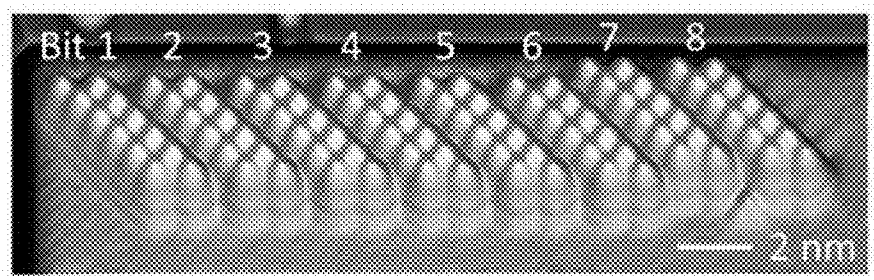
FIG. 13A is a depiction of eight (2×6) arrays of antiferromagnetically coupled atoms according to one embodiment.
Figure 13B:
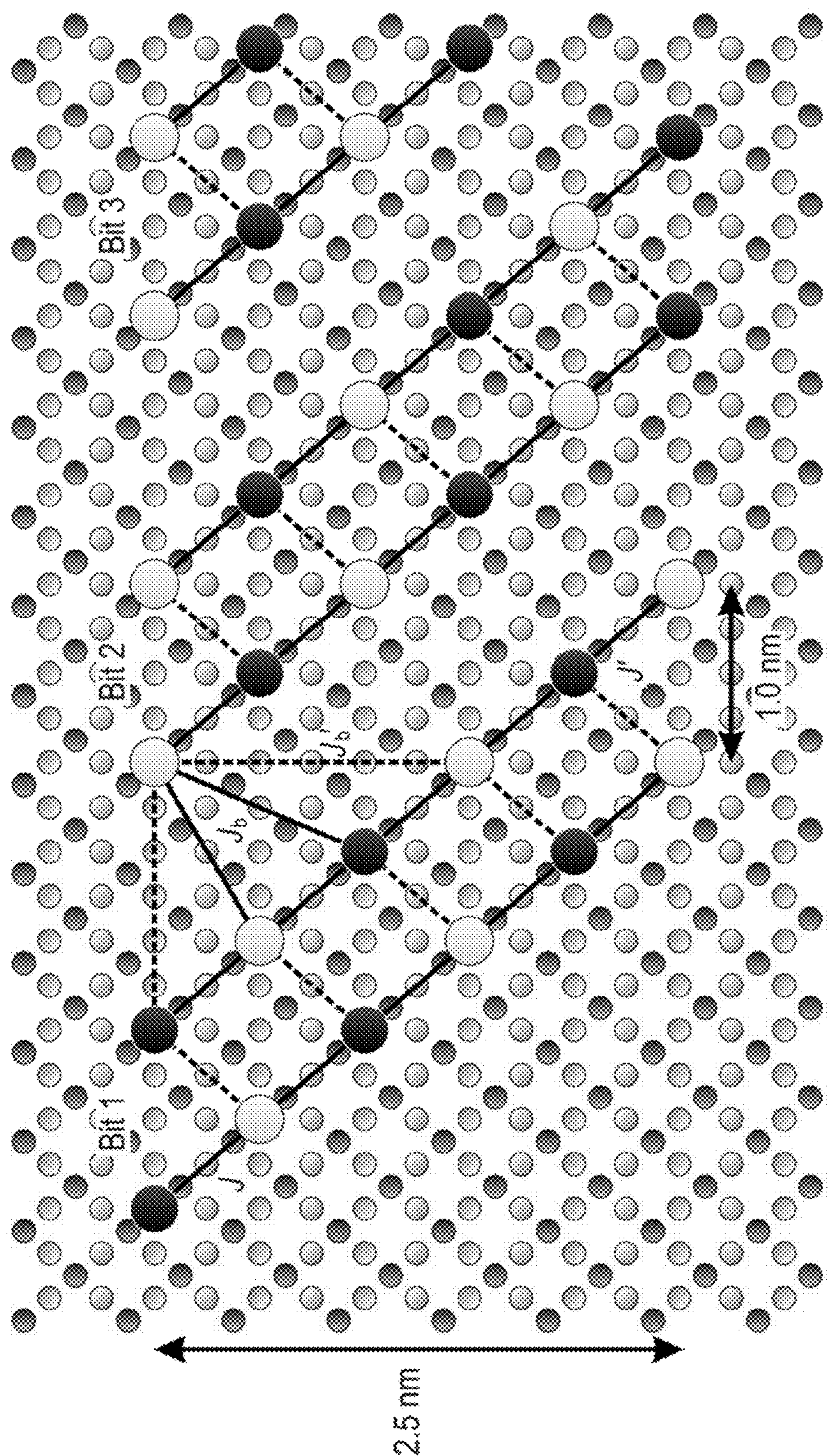
FIG. 13B is a partial graphical depiction of the bits of FIG. 13A according to one embodiment.

A major obstacle for traditional magnetic storage media is the interaction of neighboring bits due to their net magnetic moments and resultant dipolar magnetic fields. However, at atomic dimensions, exchange interactions can still cause undesired coupling between bits. The following description demonstrates how antiferromagnetic order within each bit can be used to compensate even these short range interactions. FIG. 13A shows a dense array of eight independent AFM bits that are spaced 0.9 nm from each other. The short-range decoupling is achieved through magnetic frustration. A staggered assembly that places the atoms of any given bit symmetrically between the atoms of the neighboring bits results in near-perfect cancellation of inter-bit couplings (FIG. 13B). In essence, an atom in a given bit couples equally to two atoms with opposing magnetite moment orientations in the neighboring bit ($J_b$ in FIG. 13B), which effectively cancels these pairs of magnetic interaction energies.

Figure 13C:
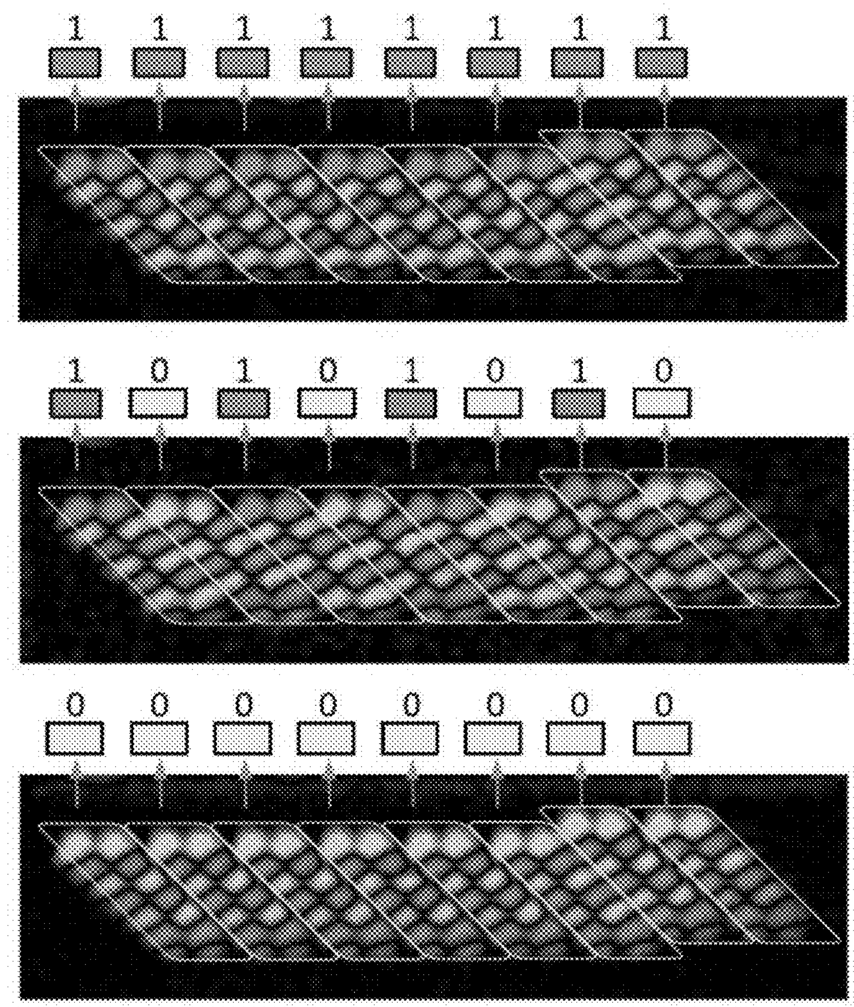
FIG. 13C is a partial graphical depiction of the bits of FIG. 13A according to one embodiment.

The 8 AFM bits can store one byte of magnetic information, e.g., each of the eight 12-atom arrays can be switched between its two Néel states independent of the others. FIG. 13C depicts short sequences of test arrangements written into the byte. Particularly, in the top image of FIG. 13C, all eight bits are in a '1' state. In the middle image, an alternating pattern of '1' and '0' is depicted. In the bottom image of FIG. 13C, all bits are in a '0' state.

Each configuration is stable over hours and read-out was easily achieved by topographic imaging. Each bit occupies an area of only 9 $nm^2$, including a spacer area, resulting in a net areal data density of about 70 Tbits/$inch^2$.

The arrangement of Fe atoms that form each bit in the byte is a variant on the (2×6) array (compare FIG. 12B and FIG.

13B) in which the ends of each bit are beveled to give the end-most atoms of each bit the same magnetic moment orientation, which gives visual clarity in viewing the state, and illustrates that the exact arrangement of atoms is not critical for stability.

This work demonstrates that switchable nanoscale antiferromagnets are candidates for memory, storage, and spintronic applications. The desire for atomically precise alignment in a read or write electrode may be relaxed by terminating the AFM array such that all magnetic moments in one face point in the same direction.

It will be clear that the various features of the foregoing methodologies may be combined in any way, creating a plurality of combinations from the descriptions presented above.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An antiferromagnetic nanostructure, comprising:

an array of at least two antiferromagnetically coupled magnetic atoms having at least two magnetic states that are stable for at least one picosecond even in the absence of interaction with an external structure, the array having a net magnetic moment of zero or about zero, wherein the array has 100 atoms or less along a longest dimension thereof.

2. An antiferromagnetic nanostructure as recited in claim 1, wherein magnetic moment orientations of the magnetic atoms in the array alternate between adjacent ones of the magnetic atoms.

3. An antiferromagnetic nanostructure as recited in claim 1, wherein the array includes at least two layers of the magnetic atoms in a stacked configuration, the atoms in each layer being antiferromagnetically coupled to other atoms in the same layer, wherein a net magnetic moment of each layer is about zero.

4. An antiferromagnetic nanostructure as recited in claim 1, wherein the array includes at least two layers of the magnetic atoms in a stacked configuration, the atoms in each layer being ferromagnetically coupled to other atoms in the same layer, wherein a net magnetic moment of adjacent layers is about zero.

5. An antiferromagnetic nanostructure as recited in claim 1, wherein multiple arrays of at least two anti ferromagnetically coupled magnetic atoms are present on a common substrate, each of the arrays having at least two magnetic states, wherein each array has a net magnetic moment of about zero.

6. An antiferromagnetic nanostructure as recited in claim 5, wherein the arrays are positioned relative to each other such that a magnetic interaction energy between adjacent arrays is at least partially canceled.

7. An antiferromagnetic nanostructure as recited in claim 5, wherein the arrays are positioned relative to each other such that a magnetic interaction energy between adjacent arrays is canceled by at least 50%.

8. A system, comprising:

an antiferromagnetic nanostructure as recited in claim 5; and at least one device for altering and/or reading the magnetic state of each of the arrays.

9. A system as recited in claim 8, wherein the at least one device is a tunneling magnetoresistance device.

10. An antiferromagnetic nanostructure as recited in claim 1, wherein the at least two magnetic states are stable for at least one microsecond.

11. An antiferromagnetic nanostructure as recited in claim 1, wherein the at least two magnetic states are stable for at least one second.

12. An antiferromagnetic nanostructure as recited in claim 1, wherein the at least two magnetic states are stable for at least one hour.

* * * * *